United States Patent
Steimle et al.

(10) Patent No.: US 9,290,380 B2
(45) Date of Patent: Mar. 22, 2016

(54) REDUCING MEMS STICTION BY DEPOSITION OF NANOCLUSTERS

(71) Applicants: Robert F. Steimle, Austin, TX (US); Ruben B. Montez, Cedar Park, TX (US)

(72) Inventors: Robert F. Steimle, Austin, TX (US); Ruben B. Montez, Cedar Park, TX (US)

(73) Assignee: Freescale Semiconductor, Inc., Austin, TX (US)

(*) Notice: Subject to any disclaimer, the term of this patent is extended or adjusted under 35 U.S.C. 154(b) by 295 days.

(21) Appl. No.: 13/718,614

(22) Filed: Dec. 18, 2012

(65) Prior Publication Data

US 2014/0167189 A1   Jun. 19, 2014

(51) Int. Cl.
*B81B 3/00* (2006.01)
*B81C 1/00* (2006.01)
*G01P 15/08* (2006.01)

(52) U.S. Cl.
CPC ............... *B81C 1/0096* (2013.01); *B81B 3/001* (2013.01); *B81B 3/0005* (2013.01); *G01P 15/0802* (2013.01); *B81B 2201/0221* (2013.01); *B81B 2201/0235* (2013.01); *B81B 2203/0181* (2013.01); *B81B 2203/06* (2013.01); *B81C 2201/115* (2013.01); *G01P 2015/0871* (2013.01); *G01P 2015/0874* (2013.01)

(58) Field of Classification Search
CPC ............... B81B 2201/0221; B81B 2201/0235; B81B 2203/0181; B81B 2203/06; B81B 3/0005; B81B 3/001; B81C 1/0096; B81C 2201/115; G01P 15/0802; G01P 2015/0871; G01P 2015/0874
See application file for complete search history.

(56) References Cited

U.S. PATENT DOCUMENTS

| | | | |
|---|---|---|---|
| 5,679,436 A * | 10/1997 | Zhao | 428/141 |
| 5,824,608 A | 10/1998 | Gotoh et al. | |
| 6,770,506 B2 | 8/2004 | Gogoi | |
| 6,841,079 B2 | 1/2005 | Dunbar et al. | |
| 6,876,046 B2 | 4/2005 | Prophet | |
| 7,057,246 B2 | 6/2006 | Reid | |
| 7,303,936 B2 | 12/2007 | Chilcott | |
| 7,482,192 B2 | 1/2009 | Yu et al. | |
| 7,662,008 B2 | 2/2010 | Hillis et al. | |
| 7,776,719 B2 | 8/2010 | Soeta et al. | |
| 7,990,349 B2 | 8/2011 | Hillis et al. | |
| 8,071,411 B2 | 12/2011 | Nabki et al. | |
| 2002/0009207 A1 | 1/2002 | Kim | |
| 2002/0047172 A1 | 4/2002 | Reid | |
| 2003/0226818 A1 | 12/2003 | Dunbar et al. | |
| 2006/0211199 A1* | 9/2006 | Rao et al. | 438/257 |
| 2007/0127164 A1 | 6/2007 | Ofek et al. | |
| 2007/0218630 A1 | 9/2007 | Yamaguchi et al. | |
| 2008/0153251 A1 | 6/2008 | Kostrzewa et al. | |
| 2009/0111267 A1 | 4/2009 | Park et al. | |
| 2009/0160040 A1 | 6/2009 | Nabki et al. | |

(Continued)

*Primary Examiner* — Ermias Woldegeorgis
*Assistant Examiner* — Benjamin Tzu-Hung Liu

(57) ABSTRACT

A mechanism for reducing stiction in a MEMS device by decreasing surface area between two surfaces that can come into close contact is provided. Reduction in contact surface area is achieved by increasing surface roughness of one or both of the surfaces. The increased roughness is provided by forming a micro-masking layer on a sacrificial layer used in formation of the MEMS device, and then etching the surface of the sacrificial layer. The micro-masking layer can be formed using nanoclusters. When a next portion of the MEMS device is formed on the sacrificial layer, this portion will take on the roughness characteristics imparted on the sacrificial layer by the etch process. The rougher surface decreases the surface area available for contact in the MEMS device and, in turn, decreases the area through which stiction can be imparted.

8 Claims, 6 Drawing Sheets

(56) References Cited

U.S. PATENT DOCUMENTS

| | | |
|---|---|---|
| 2009/0261431 A1 | 10/2009 | Caplet |
| 2011/0111545 A1 | 5/2011 | El-Gamal |
| 2011/0277827 A1* | 11/2011 | Yang et al. .................... 136/255 |
| 2013/0082338 A1* | 4/2013 | Pan et al. ...................... 257/415 |
| 2013/0157005 A1* | 6/2013 | Liu ......................... B81B 3/001 428/141 |
| 2014/0009379 A1* | 1/2014 | Giri .............................. 345/156 |

* cited by examiner

REDUCING MEMS STICTION BY DEPOSITION OF NANOCLUSTERS

BACKGROUND

1. Field

This disclosure relates generally to manufacture of microelectromechanical systems, and more specifically, to reducing stiction in MEMS devices through the use of nanoclusters as a micro-masking layer.

2. Related Art

Microelectromechanical systems (MEMS) devices are micromechanical devices that provide moving parts having features with dimensions below 100 µm. These moving parts are formed using micro-fabrication techniques. MEMS devices have holes, cavities, channels, cantilevers, membranes, and the like. These devices are typically based on silicon materials and use a variety of techniques to form the proper physical structures and to free the mechanical structures for movement.

Stiction is a static friction force that is a recurrent problem with typical MEMS devices. While any solid objects pressing against each other without sliding require some threshold of force (stiction) to overcome static cohesion, mechanisms generating this force are different for MEMS devices. When two surfaces with areas below the micrometer range come into close proximity, the surfaces may adhere together due to electrostatic and/or Van der Waals forces. Stiction forces at this scale can also be associated with hydrogen bonding or residual contamination on the surfaces.

For MEMS devices such as accelerometers, surfaces such as over-travel stops come into close proximity or contact during use at the limits of the device design. In those situations, stiction forces can cause the MEMS device parts (e.g., a teeter-totter accelerometer mechanism) to freeze in place and become unusable. Traditional methods of avoiding such close proximity travel or contact include increasing spring constants and increasing distance between parts of the MEMS device. But compensating for stiction in this manner can decrease sensitivity of the device, and therefore decrease the utility of the MEMS device. It is therefore desirable to provide a mechanism for reducing stiction-related interactions of MEMS devices without also decreasing sensitivity of the MEMS device.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates identical items unless otherwise noted. The figures are not necessarily drawn to scale.

DETAILED DESCRIPTION

Embodiments of the present invention provide a mechanism for reducing stiction in a MEMS device by decreasing surface area between two surfaces that can come into close contact. Reduction in surface area is achieved by increasing surface roughness of one or both of the surfaces. Embodiments provide such increased roughness by forming a micro-masking layer on a sacrificial layer used in formation of the MEMS device, and then etching the surface of the sacrificial layer. The micro-masking layer can be formed using nanoclusters (e.g., poly silicon or poly germanium). When a next portion of the MEMS device is formed on the sacrificial layer, this portion will take on the roughness characteristics imparted on the sacrificial layer by the etch process. The rougher surface decreases the surface area available for contact in the MEMS device and, in turn, decreases the area on which stiction can be imparted.

Figure 1:
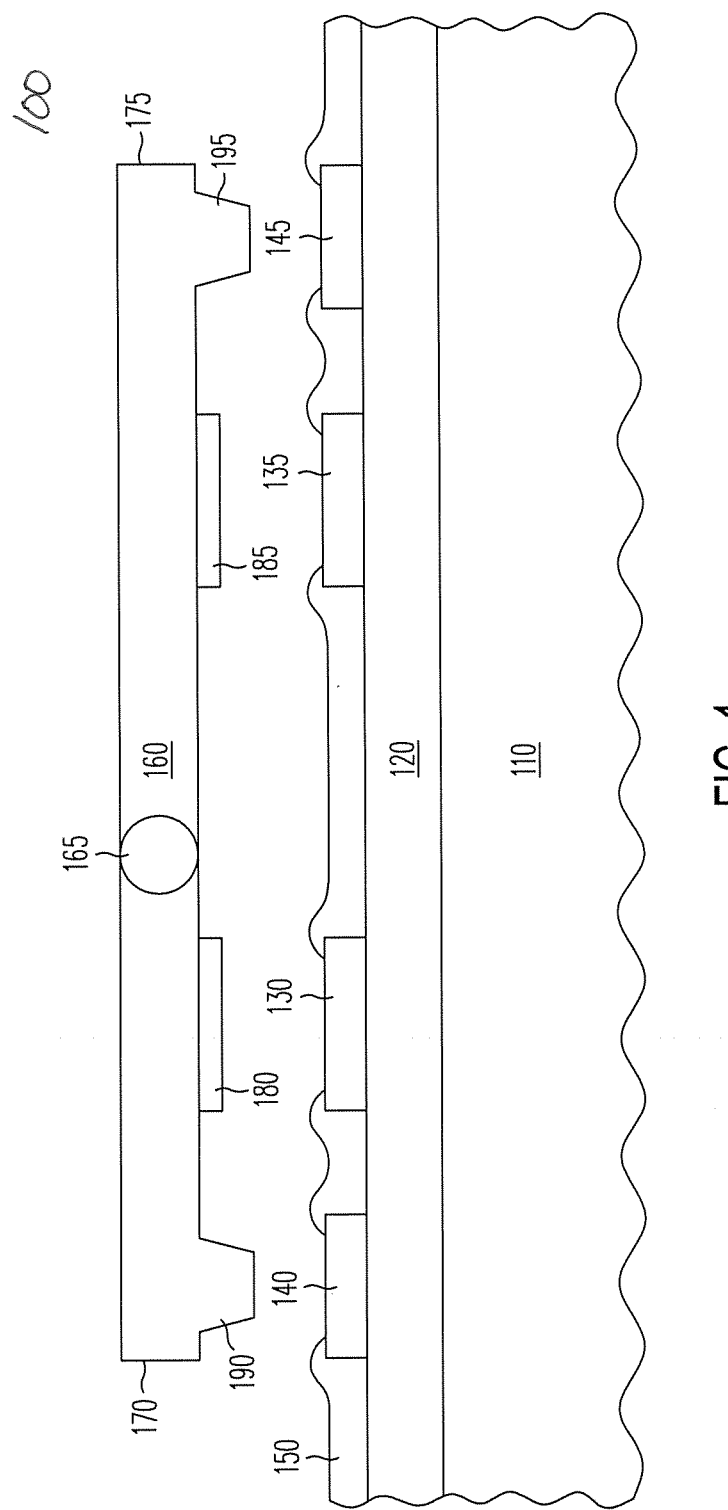
FIG. 1 is a simplified block diagram illustrating a cross section view of an accelerometer known in the prior art.

FIG. 1 is a simplified block diagram illustrating a cross section view of a teeter totter accelerometer as known in the art. Accelerometer 100 includes a substrate 110 with an insulating layer 120. Substrate 110 can be, for example, a silicon wafer and insulating layer 120 can be, for example, a silicon oxide or silicon nitride. In some cases, insulating layer 120 can be thermally grown from substrate 110 or the insulating layer can be deposited.

Fixed electrodes 130 and 135 are formed on top of insulating layer 120, along with travel stop regions 140 and 145. The layer forming fixed electrodes 130 and 135 and travel stop regions 140 and 145 is typically polysilicon and is formed using conventional techniques, including patterning the layer as desired for the application. The layer forming the fixed electrodes and travel stop regions can also be amorphous silicon, a nitride, a metal-containing material, another suitable material, and the like, or any combination thereof. A dielectric layer 150 is formed to electrically isolate the electrodes and travel stop regions from other elements of the MEMS accelerometer. Dielectric layer 150 can be formed from a variety of materials, including, for example, silicon nitride, silicon dioxide, silicon oxynitride, and the like.

A pivoting proof mass 160 is configured to move in a manner similar to that of a teeter totter upon acceleration. Pivoting proof mass 160 can be configured in a manner such that there is an imbalance between a side 170 of the pivoting proof mass and side 175 of the pivoting proof mass through pivot point 165. The amount of imbalance will have an effect of making the device more or less sensitive to acceleration. An electrode 180 configured on side 170 of the pivoting proof mass is associated with fixed electrode 130, while an electrode 185 on the pivoting proof mass is associated with fixed electrode 135. In addition, a travel stop 190 on side 170 of the pivoting proof mass is associated with travel stop region 140 and a travel stop 195 on side 175 of the pivoting proof mass is associated with travel stop region 145. Pivoting proof mass 160, including travel stops 190 and 195 are typically formed of polysilicon.

Electrode 180 and fixed electrode 130 form a first variable sense capacitor, while electrode 185 and fixed electrode 135 form a second variable sense capacitor. Changes in the capacitances of the first and second variable sense capacitors can be combined to provide a differential output from MEMS accelerometer 100.

Fabrication of the components of MEMS accelerometer 100 can be performed using known MEMS fabrication processes.

Figure 2:
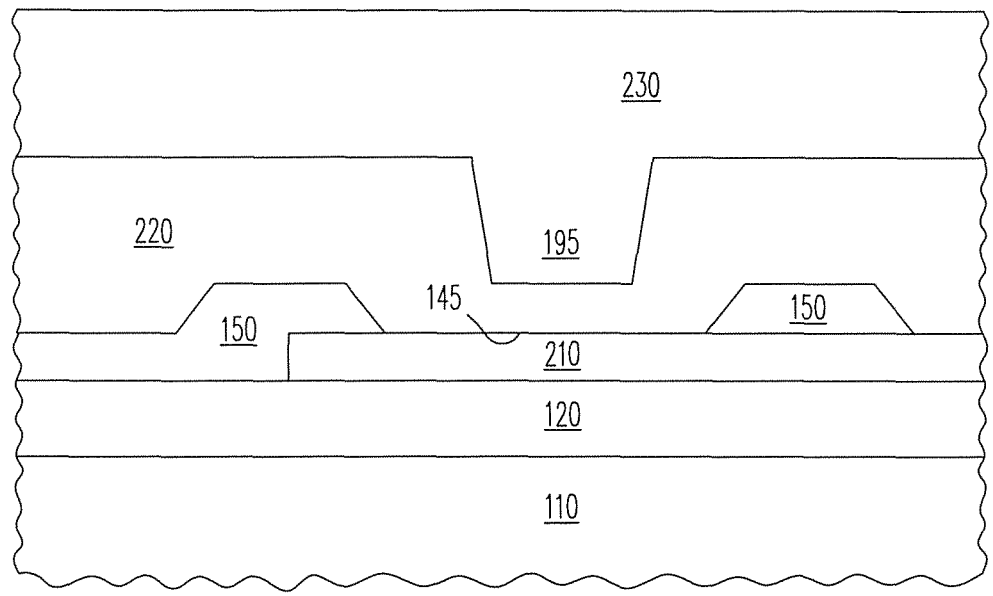
FIG. 2 is a simplified block diagram illustrating a close up of a cross section view of the travel stop region at an end of a MEMS accelerometer during a stage of fabrication.

FIG. 2 is a simplified block diagram illustrating a close up of a cross section view of the travel stop region at end 175 of MEMS accelerometer 100 during a stage of fabrication. As discussed above, a substrate 110 is provided with insulating layer 120, where substrate 110 can be a silicon wafer and insulating layer 120 can be a silicon oxide. A first polysilicon layer 210 is formed on insulating layer 120, forming, in part, travel stop region 145. Dielectric layer 150 is formed over insulating layer 120 and polysilicon layer 210, in order to, for example, prevent excessive etching of insulating layer 120. A sacrificial layer 220 is formed on top of patterned dielectric layer 150 and exposed regions of polysilicon layer 210. Sacrificial layer 220 is commonly formed using tetraethyl orthosilicate (TEOS) gas to form a sacrificial layer of silicon oxide or the sacrificial layer can be formed of phosphosilicate glass (PSG). The sacrificial layer can be patterned to form a "mold" for the next layer of the MEMS device. A second polysilicon layer 230 can be formed on the patterned sacrificial layer to form pivoting proof mass 160, including travel stop 195. The buildup of patterned layers can continue as needed for the application.

Figure 3:
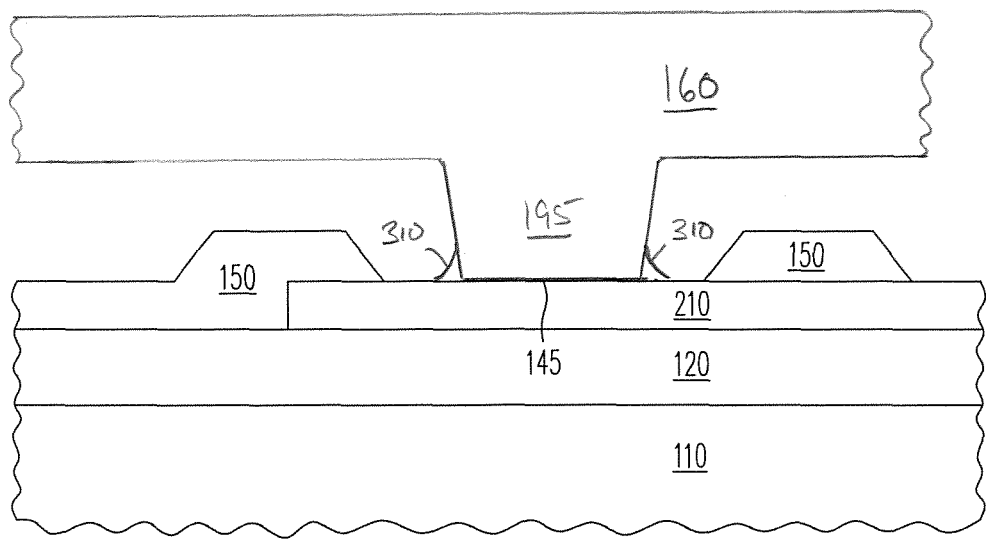
FIG. 3 is a simplified block diagram illustrating a cross-section view of the travel stop region during a stage of fabrication subsequent to that of FIG. 2.

FIG. 3 is a simplified block diagram illustrating a cross-section view of the travel stop region during a stage of fabrication subsequent to that of FIG. 2. Sacrificial layer 220 is commonly removed using an isotropic wet etch process selective to the sacrificial layer. Such an etch is performed by either a vapor or a liquid phase process. But capillary forces due to surface tension of the liquid used for the etching process or liquid byproducts of the etch process, between travel stop 195 and polysilicon travel stop region 145, as illustrated by meniscus 310, can cause the surfaces to adhere together during drying. Separating the two surfaces is complicated due to the fragile nature of the microstructure. Use of travel stops helps to minimize contact between surfaces in a MEMS device, which can help to reduce adhesion during drying. But this does not necessarily eliminate the problem, as the surface of the travel stop is subject to stiction as well.

Figure 4:
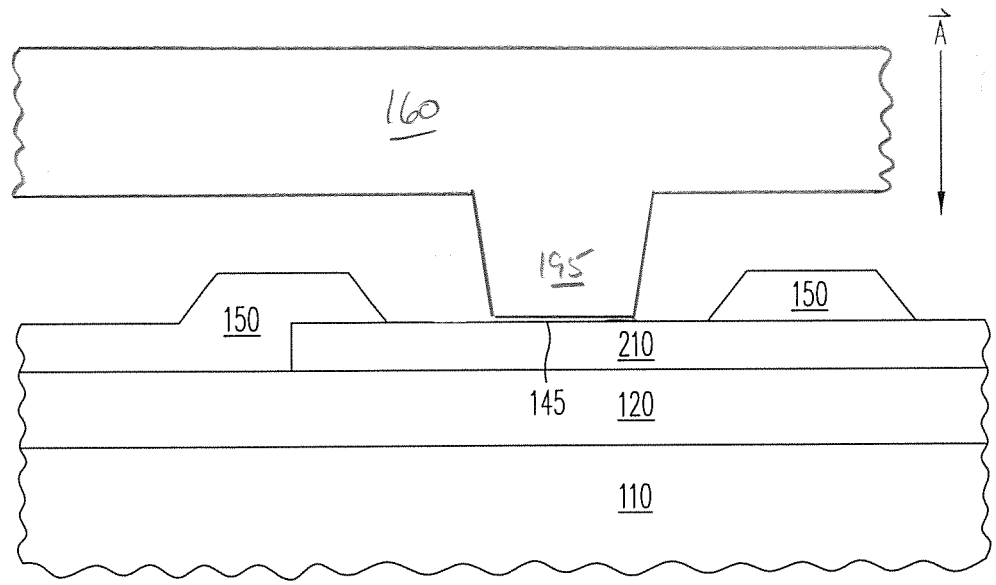
FIG. 4 is a simplified block diagram illustrating a cross-section view of the travel stop region during use of the accelerometer.

FIG. 4 is a simplified block diagram illustrating a cross-section view of the travel stop region during a use of the accelerometer. Acceleration A on pivoting proof mass 160 is sufficient to exceed the design specification for the accelerometer. This causes travel stop 195 to impact travel stop region 145, thereby preventing contact of electrode 185 to fixed electrode 135. In this case, however, stiction forces such as Van der Waals, electrostatic, and/or hydrogen bonding can cause the travel stop surface to stick to the travel stop region. It is desirable to prevent stiction in both the scenarios illustrated in FIG. 3 and FIG. 4.

Embodiments of the present invention provide a mechanism by which the surface area of travel stop 195 that can come in contact with travel stop region 145 is reduced. As discussed above, the reduced surface area decreases the magnitude of the stiction forces. This is accomplished by roughing up at least the contact surface of travel stop 195 by modifying the surface of sacrificial layer 220 at least in the region in which travel stop 195 is formed.

Figure 5:
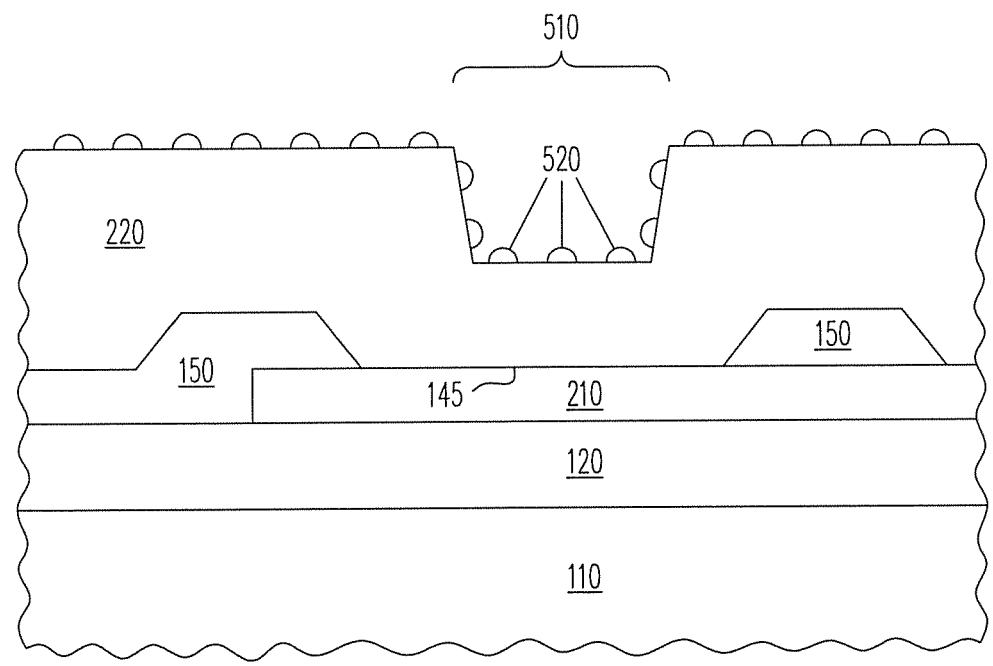
FIG. 5 is a simplified block diagram illustrating a cross-section view of the travel stop region during a stage of fabrication performed in accord with embodiments of the present invention.

FIG. 5 is a simplified block diagram illustrating a cross-section view of the travel stop region during a stage of fabrication performed in accord with embodiments of the present invention. As described above with regard to FIG. 2, sacrificial layer 220 is formed above deposited and patterned polysilicon layer 210 and dielectric layer 150. A region 510 is formed by patterning and etching the sacrificial layer, and corresponds to travel stop 195. Subsequent to the forming and patterning of sacrificial layer 220, nanoclusters 520 are formed on the surface of sacrificial layer 220. In one embodiment of the present invention, nanoclusters 520 are formed using methods known in the art of nanocrystalline silicon. For example, a low temperature, low pressure chemical vapor deposition process can be used to partially deposit polycrystalline silicon on the available surface of sacrificial layer 220. An anneal process is then performed, which causes the deposited silicon to cluster and form spherical or hemispherical regions of silicon that are called nanoclusters. Alternatively, low temperature, low pressure deposition of polycrystalline germanium can be performed and used in the formation of nanoclusters 520.

Embodiments of the present invention are not limited to using silicon or germanium nanoclusters. As will be discussed more fully below, the nanocluster layer is used as a micro-masking layer for an etch that has the purpose of adding surface roughness to the sacrificial layer. Any suitable material that can form nanoclusters that will adhere to the surface of the sacrificial layer for etching is within the scope of the present invention. If the nanocluster material is not compatible with further processing, then that material will be removed selectively from the sacrificial material subsequent to deposition of a second polysilicon layer on the sacrificial layer.

Further, a variety of methods for depositing nanocrystals or nanoclusters can be used (e.g., aerosol coating, spin on coating, and laser ablation and re-deposition). In one embodiment, low temperature, low pressure chemical vapor deposition is preferred because such a deposition technique fits well within a standard process flow for formation of MEMS devices.

As stated above, one goal is to decrease the surface area of the travel stop that comes in contact with the travel stop region. Thus, the nanoclusters formed on the sacrificial layer region should be of sufficient size to effectively increase the roughness of the travel stop surface. In a typical MEMS device, surface roughness of a polysilicon layer formed on top of the sacrificial layer is about 5 nm. To increase the roughness by five to ten times, nanoclusters should be formed that are on the order of 200 Å. Combined with subsequent processing, discussed more fully below, nanoclusters of this size provide the desired surface roughness. Desired nanocluster size can be provided by selecting process conditions (e.g., deposition time). In addition, the nanoclusters material need not form isolated nanoclusters. Instead, the nanoclusters layer can be a network of the nanoclusters material that is configured to allow the underlying sacrificial material to be exposed to etchant for formation of a topography thereon. In one embodiment, the surface coverage of the material can be less than 90%, such that significant roughness can be introduced through the etch.

Figure 6:
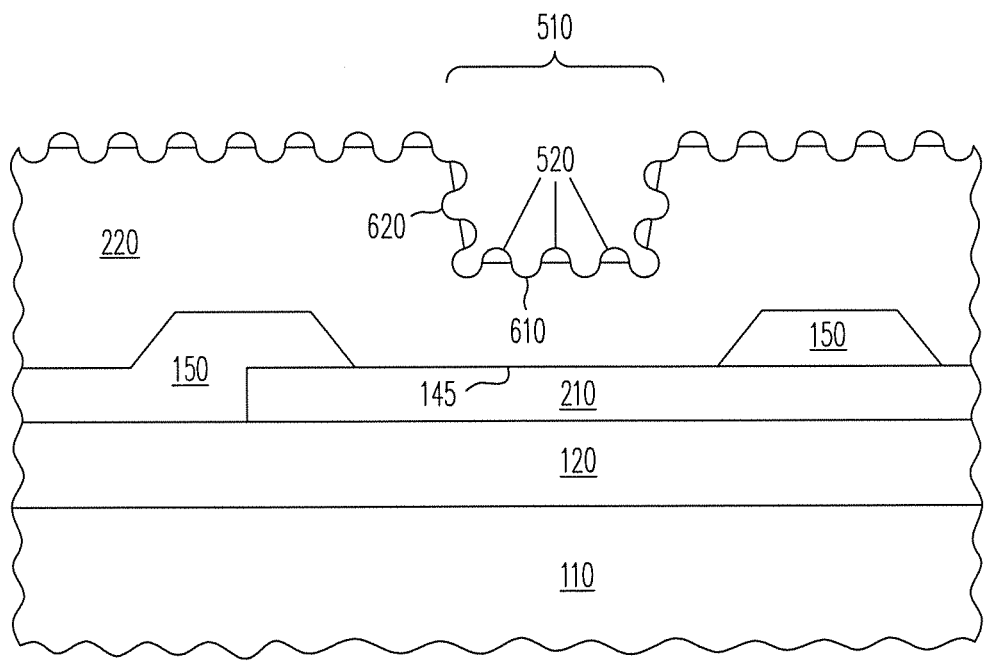
FIG. 6 is a simplified block diagram illustrating a cross-section view of the travel stop region during a stage of fabrication subsequent to that illustrated in FIG. 5.

FIG. 6 is a simplified block diagram illustrating a cross-section view of the travel stop region during a stage of fabrication subsequent to that illustrated in FIG. 5. An etch is performed that is selective to the sacrificial layer. During the etch, the nanoclusters function as a micro-masking layer and indentations 610 are formed in the surface of sacrificial layer 220. As will be discussed more fully below, indentations 610 serve to increase the surface roughness of travel stop 195. For example, in order to form indentations that have a curved feature, as shown, a wet etch process is preferred. The length of time during which the wet etch is performed should be sufficient to provide indentations of a depth that will aid in formation of a sufficiently rough surface on the travel stop. Other types of etches, such as an anisotropic dry etch, will form indentations of a different shape.

Wet etch chemistries are dependent upon the nature of the materials being etched and those for which it is desired not to etch (e.g., the nanoclusters). For example, silicon nanoclusters will not etch in a peroxide etchant, while germanium nanoclusters etch readily in a peroxide etchant. Further, the nature of the materials used for the sacrificial layer can dictate the type of etchant materials used.

Figure 7:
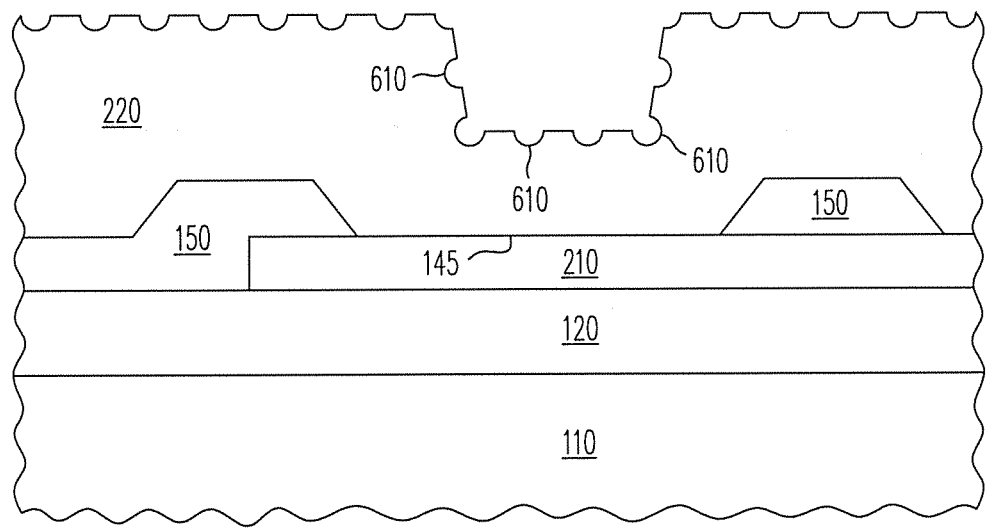
FIG. 7 is a simplified block diagram illustrating a cross-section view of the travel stop region during a stage of fabrication subsequent to that illustrated in FIG. 6.

FIG. 7 is a simplified block diagram illustrating a cross-section view of the travel stop region during a stage of fabrication subsequent to that illustrated in FIG. 6. In FIG. 7, nanoclusters 520 have been removed from the surface of sacrificial layer 220. This removal of the nanoclusters results in leaving only indentations 610. Removal of the nanoclusters can be performed using an etchant that is selective to the nanocluster material. Alternatively, if the nanocluster material is compatible with the material to be deposited on top of the sacrificial layer that will form, for example, the travel stop of a pivoting proof mass (e.g., polysilicon), then the nanoclusters need not be removed as they will merge with the polysilicon. Thus, silicon-based nanoclusters can be left on the surface of sacrificial layer if the pivoting proof mass is polysilicon, while germanium-based nanoclusters should be removed.

Figure 8:
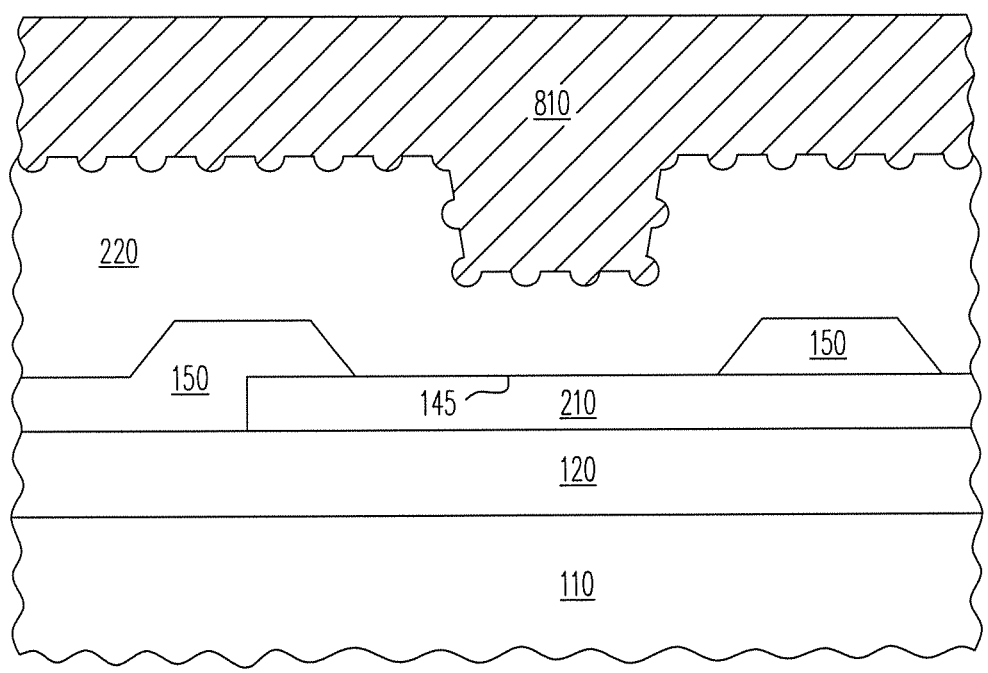
FIG. 8 is a simplified block diagram illustrating a cross-section view of the travel stop region during a stage of fabrication subsequent to that illustrated in FIG. 7.

FIG. 8 is a simplified block diagram illustrating a cross-section view of the travel stop region during a stage of fabrication subsequent to that illustrated in FIG. 7. In FIG. 8, a second polysilicon layer 810 is deposited over the indented surface of sacrificial layer 220. The material of polysilicon layer 810 fills indentations 610 and forms, for example, the pivoting proof mass of a teeter-totter accelerometer. As stated above, formation of polysilicon layer 810 can be performed using standard techniques known in the art of forming MEMS devices.

Figure 9:
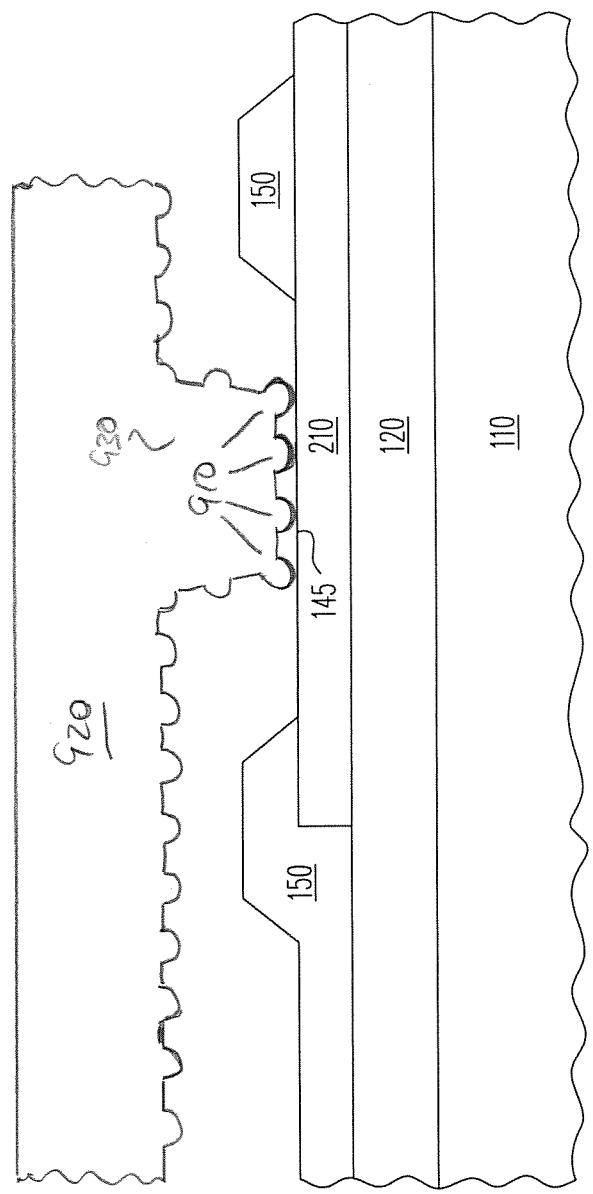
FIG. 9 is a simplified block diagram illustrating a cross-section view of the travel stop region subsequent to removal of a sacrificial layer, where the travel stop is formed in accord with embodiments of the present invention.

FIG. 9 is a simplified block diagram illustrating a cross-section view of the travel stop region subsequent to removal of sacrificial layer 220 to free the movable portion of the MEMS device, where the travel stop is formed in accord with embodiments of the present invention. Using the process described above, travel stop 930 on pivoting proof mass 920 and includes a surface having bumps 910. In a situation in which travel stop 930 comes in contact with travel stop region 145, bumps 910 reduce the contacting surface area. This reduction in surface area decreases the chance for stiction by both wet stiction and electrostatic/Van der Waals type forces.

One advantage of reducing the chances for stiction to occur in accelerometer-type MEMS devices is improved sensitivity of the device. In one type of traditional MEMS accelerometer, stiction force is countered by increasing a spring constant of the device. But increasing the spring constant decreases sensitivity of the MEMS device to light acceleration forces. In another type of traditional MEMS device, chances for stiction occurring are sought to be reduced by increasing the distance between the movable portions of the device and the fixed portions of the device. But this increases the distance between the capacitive plates and can therefore decrease differences in measured capacitance. Reducing stiction forces by using embodiments of the present invention allow for lower spring constants and smaller distances between parts, both of which can improve device sensitivity. Further, smaller overall device sizes can be realized by decreasing the distances between the parts. This can, in turn, provide a decreased footprint for each MEMS device, thereby allowing for incorporation of more MEMS devices in a system or a smaller system size.

By now it should be appreciated that there has been provided a method for manufacturing a micro electromechanical systems device, in which the method includes: forming a first polysilicon layer over a substrate; forming a sacrificial layer over the first polysilicon layer; forming a plurality of nanoclusters on the sacrificial layer; etching the sacrificial layer using a wet etch process subsequent to forming the plurality of nanoclusters; and forming a second polysilicon layer on the sacrificial layer subsequent to said etching of the sacrificial layer. The wet etch is selective to the sacrificial layer. The nanoclusters provide a micro-masking layer for the etching, which increases roughness of the surface of the sacrificial layer as compared to the roughness of the surface upon forming the sacrificial layer.

In one aspect of the above embodiment, the method further includes removing the nanoclusters from the surface of the sacrificial layer. Removing of the nanoclusters is performed subsequent to the etching and prior to forming the second polysilicon layer. In a further aspect, the nanoclusters include germanium and the removing is performed using a peroxide etch. In another aspect of the above embodiment, the nanoclusters include one of silicon or germanium.

In another aspect of the above embodiment, forming the plurality of nanoclusters includes performing a low-temperature deposition of nanocluster material and performing an anneal to form the nanoclusters. In a further aspect, performing the low-temperature deposition of nanocluster material further includes depositing sufficient material to form nanoclusters having a diameter of approximately 20 nm or greater upon performing said annealing.

Another aspect of the above embodiment further includes forming a first insulating layer over the substrate where the first polysilicon layer is formed over the first insulating layer, and forming a second insulating layer over at least a portion of the first polysilicon layer where the sacrificial layer is further formed over the second insulating layer. In another aspect of the above embodiment, the method further includes removing the sacrificial layer using a wet etch process subsequent to forming the second polysilicon layer. In a further aspect, the second polysilicon layer includes a plurality of surface roughness features having a height between about 25 nm to about 50 nm.

Another embodiment of the present invention provides a micro electromechanical systems device that includes a fixed surface having a first polysilicon layer formed over a substrate and a first insulating layer formed over at least a portion of the first polysilicon layer, and a movable body including a second polysilicon layer providing a major surface facing the fixed surface where the major surface includes a plurality of surface roughness features having a height of between about 25 nm to about 50 nm.

In one aspect of the above embodiment the movable body includes a pivoting proof mass of a teeter-totter accelerometer and a travel stop feature. The travel stop feature is configured to contact the first polysilicon layer to prevent over rotation of the pivoting proof mass and includes a portion of the major surface facing the fixed surface.

In another aspect of the above embodiment the movable body is formed using a process that includes: forming a sacrificial layer over the fixed surface; forming a plurality of nanoclusters on the surface of the sacrificial layer facing away from the fixed surface; etching the sacrificial layer using a wet etch process subsequent to forming the plurality of nanoclusters; and forming the second polysilicon layer on the sacrificial layer subsequent to etching the sacrificial layer. The wet etch is selective to the sacrificial layer. The nanoclusters provide a micro-masking layer for the etching, and the etching provides a roughness to the sacrificial layer that is imparted to the second polysilicon layer during formation of the second polysilicon layer. In a further aspect, the nanoclusters include one of silicon or germanium. In still a further aspect, the second polysilicon layer includes at least a portion of the plurality of nanoclusters, if the nanoclusters include silicon. In another further aspect, the sacrificial layer includes one of tetraethyl orthosilicate-based silicon oxide or phosphosilicate glass. In another aspect of the above embodiment the MEMS device includes at least a portion of an accelerometer.

Another embodiment of the present invention provides a method for manufacturing a micro-electromechanical systems device, wherein the method includes: forming a fixed surface; forming a movable body providing a major surface facing the fixed surface where at least a portion of the major surface is configured to contact at least a portion of the fixed surface; and forming of the portion of the major surface configured to contact the portion of the fixed surface such that the portion of the major surface includes a surface roughness at least five times greater than a non-roughened portion of the major surface.

In one aspect of the above embodiment, forming the portion of the first major surface as that portion of the major surface includes a surface roughness at least five times greater than a non-roughened portion of the major surface involves: forming a sacrificial layer over the fixed surface; forming a plurality of nanoclusters on the sacrificial layer; etching the sacrificial layer using a wet etch process subsequent to forming the plurality of nanoclusters; and forming the movable body on the sacrificial layer after etching the sacrificial layer wherein the at least a portion of the major surface configured to contact at least a portion of the fixed surface is formed in contact with the etched sacrificial layer. The wet etch is selective to the sacrificial layer. The nanoclusters provide a micromasking layer for the etching, and the etching increases roughness of the surface of the sacrificial layer as compared to the roughness of the surface upon forming the sacrificial layer. In a further aspect, forming the plurality of nanoclusters includes performing a low temperature deposition of nanocluster material, and performing an anneal to form the nanoclusters. In still a further aspect, performing the low-temperature deposition of nanocluster material further includes depositing sufficient material to form nanoclusters having a diameter approximately 20 nm or greater upon performing the annealing. A size of the nanoclusters is proportional to a time period of the low temperature deposition of nanocluster material.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

It is to be understood that the architectures depicted herein are merely exemplary, and that in fact many other architectures can be implemented which achieve the same functionality. In an abstract, but still definite sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality.

Furthermore, those skilled in the art will recognize that boundaries between the functionality of the above described operations merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

Although the invention is described herein with reference to specific embodiments, various modifications and changes can be made without departing from the scope of the present invention as set forth in the claims below. For example, the description of embodiments of the invention relates to a teeter-totter type accelerometer. Embodiments of the present invention are not limited to teeter-totter accelerometers, but can include accelerometers having a mass suspended by springs, or other MEMS devices that have a potential for components to come in contact with one another during operation or manufacture. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A method for manufacturing a microelectromechanical systems (MEMS) device, the method comprising:
   forming a first polysilicon layer over a substrate;
   forming a sacrificial layer over the first polysilicon layer;
   forming a plurality of nanoclusters on the sacrificial layer;
   etching the sacrificial layer using a wet etch process subsequent to said forming the plurality of nanoclusters, wherein
      the wet etch is selective to the sacrificial layer,
      the nanoclusters provide a micro-masking layer for said etching, and
      said etching increases roughness of the surface of the sacrificial layer as compared to the roughness of the surface upon said forming the sacrificial layer;
   removing the nanoclusters from the surface of the sacrificial layer; and
   forming a second polysilicon layer on the sacrificial layer subsequent to said etching the sacrificial layer, wherein said removing is performed subsequent to said etching and prior to said forming the second polysilicon layer.

2. The method of claim 1, wherein
   the nanoclusters comprise germanium, and
   said removing is performed using a peroxide etch.

3. The method of claim 1 wherein said nanoclusters comprise one of silicon or germanium.

4. The method of claim 1 wherein said forming the plurality of nanoclusters comprises:
   performing a low temperature deposition of nanocluster material; and
   performing an anneal to form the nanoclusters.

5. The method of claim 4 wherein said performing the low temperature deposition of nanocluster material further comprises:
   depositing sufficient material to form nanoclusters having a diameter of approximately 20 nm or greater upon performing said annealing.

6. The method of claim 1 further comprising:
   forming a first insulating layer over the substrate, wherein the first polysilicon layer is formed over the first insulating layer;
   forming a second insulating layer over at least a portion of the first polysilicon layer, wherein
      the sacrificial layer is further formed over the second insulating layer.

7. The method of claim 1 further comprising:
   removing the sacrificial layer using a wet etch process subsequent to said forming the second polysilicon layer.

8. The method of claim 7, wherein the second polysilicon layer comprises a plurality of surface roughness features having a height of between about 25 nm to about 50 nm.

* * * * *